United States Patent [19]

Kaufman

[11] Patent Number: 4,596,004
[45] Date of Patent: Jun. 17, 1986

[54] HIGH SPEED MEMORY WITH A MULTIPLEXED ADDRESS BUS

[75] Inventor: Dan R. Kaufman, Kingston, N.Y.

[73] Assignee: International Business Machines Corporation, Armonk, N.Y.

[21] Appl. No.: 532,113

[22] Filed: Sep. 14, 1983

[51] Int. Cl.$^4$ .......................... G11C 8/00; G11C 11/40
[52] U.S. Cl. .................................. 365/233; 365/193; 365/194; 364/200
[58] Field of Search ............... 365/233, 230, 194, 195, 365/193; 364/200 MS File, 900 MS File

[56] References Cited

U.S. PATENT DOCUMENTS

| 3,786,277 | 1/1974 | Basse | 365/233 |
|---|---|---|---|
| 3,969,706 | 7/1976 | Proebsting et al. | 340/173 R |
| 4,060,794 | 11/1977 | Feldman et al. | 365/233 |
| 4,293,932 | 10/1981 | McAdams | 365/222 |
| 4,354,259 | 10/1982 | Ishimoto | 365/230 |
| 4,412,314 | 10/1983 | Proebsting | 365/195 |

FOREIGN PATENT DOCUMENTS

| 0080902 | 6/1983 | European Pat. Off. | 365/230 |
|---|---|---|---|
| 0006429 | 1/1979 | Japan | 365/194 |

OTHER PUBLICATIONS

"1K CMOS RAM Needs Only 8 Pins", Electronic Product Design, Oct. 1981, p. 9.

Primary Examiner—James W. Moffitt
Assistant Examiner—Glenn A. Gossage
Attorney, Agent, or Firm—Curtis G. Rose; J. Jancin, Jr.; E. Lester

[57] ABSTRACT

Memory access time, noise and costs are substantially reduced while reliability is increased by replacing fixed delay lines with a dynamic delay. This dynamic delay is placed on the same integrated circuit as the remainder of the memory access circuitry to eliminate tracking problems associated with off-chip delay lines. The dynamic delay element is activated after all of the row address strobe (RAS) bits have been generated. These RAS bits serve to strobe the row column address bits initially present on the address bus into the memory. After the delay time has elapsed an address multiplexor switches column address bits onto the address bus to replace the prior row address bits. As soon as this switch is completed column address strobe (CAS) bits are generated to strobe the column address bits into the memory.

7 Claims, 6 Drawing Figures

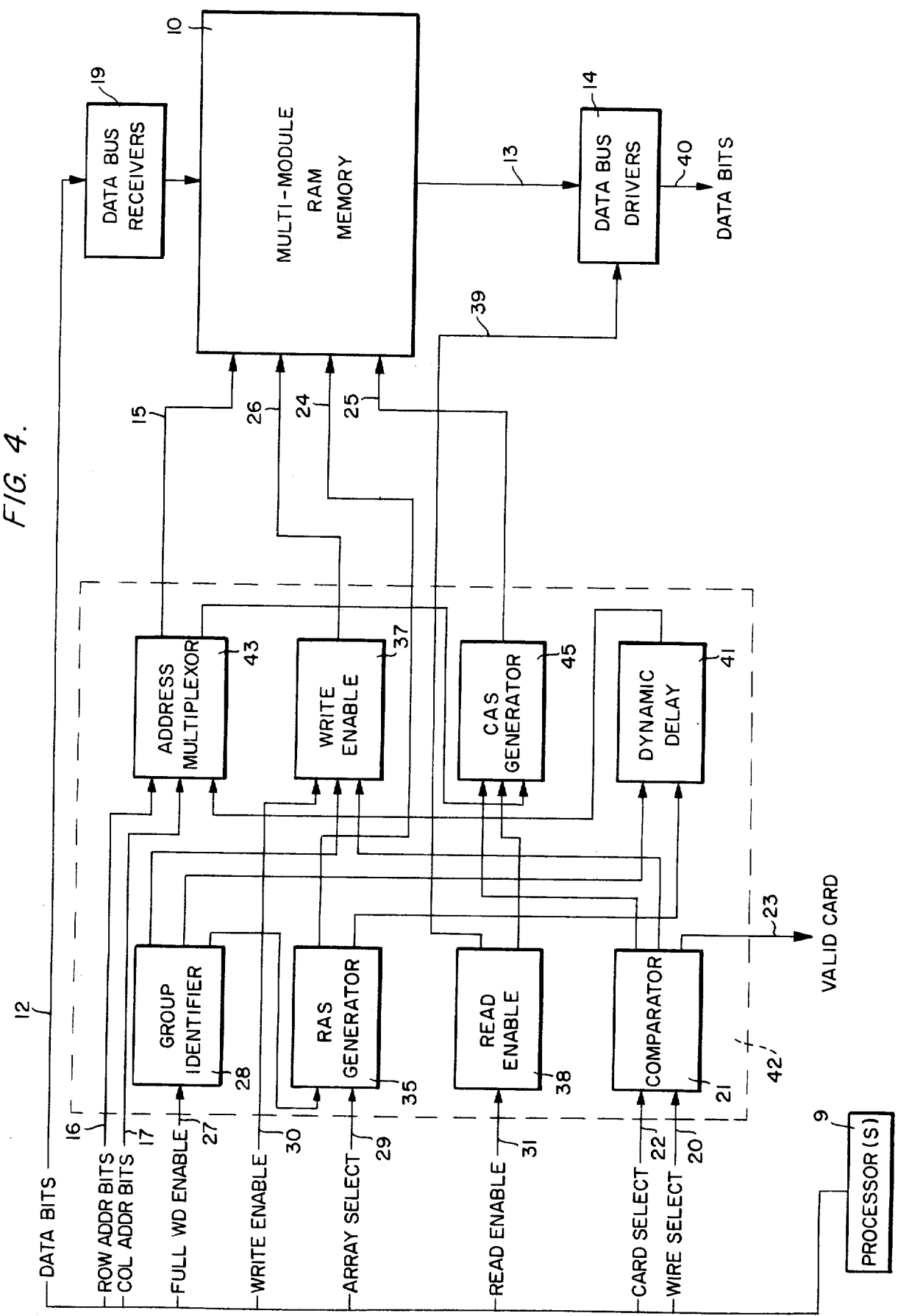

HIGH SPEED MEMORY WITH A MULTIPLEXED ADDRESS BUS

TECHNICAL FIELD

The invention relates to accessing a memory system.

BACKGROUND ART

Many dynamic Random Access Memory (RAM) systems use a multiplexed address bus. This arrangement, for example, requires that half of the necessary address bits be consecutively placed on the address bus (e.g., first the row address bits and then the column address bits). No accurate memory access can, of course, occur until the entire address has been strobed into the memory. Reducing the time required to strobe in the row address bits, switch the bits on the address bus from row address bits to column address bits, and then strobe these column address bits into the memory is, therefore, critical to enhancing the speed of memory operations.

Previous memory systems rely on fixed delays to properly control memory accesses via a multiplexed address bus. A first fixed delay line has been used to ensure that sufficient time has elapsed between generation of the row address strobe (RAS) bits and the switching of the address bus from row address bits to column address bits. During this first fixed delay period the row address bits present on the address bus are strobed into the memory by the RAS bits. If the first fixed delay is set too short, the row address bits will not be strobed into the memory before the row address bits are replaced by column address bits. This would result in the erroneous addressing and subsequent accessing of an unwanted memory location. If this first fixed delay is set too long the memory access times will be unnecessarily long and memory and associated system operations will, therefore, be slower.

The second fixed delay line employed in current memory systems is inserted between switching the address bus from row to column address bits and the generation of column address strobe (CAS) bits which strobe these column address bits into memory. This second fixed delay ensures that a sufficient amount of time elapses between these two events so that all the bits on the address bus will indeed be column address bits and not prior row address bits which have yet to be switched or are in the process of being switched to column address bits. As with the first fixed delay period described above, the wrong memory location will be addressed and then accessed if the second fixed delay is set too short and memory operations will be unduly long if this second fixed delay is set too long.

The two fixed delays used in previous memory systems are also not located on the same integrated circuit as the RAS generator, CAS generator and the address bus multiplexor (e.g., due to temperature induced circuit timing delays, power supply variations or technology variations). This can result in a lack of tracking between the fixed delay lines and the RAS and CAS generators and the address bus multiplexor. This lack of tracking may require setting the two fixed delay periods longer than actually necessary in order to ensure that these delays will not be seen as too short due to tracking differences. The result is an accurate, but slowly operating memory system.

DISCLOSURE OF THE INVENTION

The present invention provides for accessing a selected location within a memory by placing a first group of address bits on an address bus and then generating a first group of address strobe bits to strobe this first group of address bits into the memory. A dynamic delay element is activated after all of the bits in the first group of address strobe bits have been generated. After this time delay period has elapsed, a second group of address bits is multiplexed onto the address bus. After this multiplexing is completed a second group of address strobe bits is generated to strobe the second group of address bits into the memory. A logic gate is used as a detection means to ascertain when the multiplexing is completed and thus enable the generation of the second group of address strobe bits. Moreover, tracking among interrelated functions is realized by placing these functions on a single integrated circuit.

The present invention substantially reduces memory access time as a result of the efficient multiplexing of the first and second groups of address bits. The dynamic delay element and the logical detection means of the present invention replace the two relatively expensive and unreliable fixed delay lines of previous memory systems. Unlike previous memory systems, the present invention allows the dynamic delay element to be activated as soon as all RAS bits are generated. The memory access is also not dependent on a fixed, error-prone delay time. Moreover, the present invention speeds memory access by generating the strobe address bits associated with the second group of address bits as soon as the multiplexing of bits on the address bus has been completed. Again there is no dependence on a fixed error-prone delay as with current memory systems. The memory access speed is optimized by permitting the access to occur as fast as possible by eliminating excess delay times previously inherent in off-chip fixed delay lines through the use of an integrated dynamic timing technique and apparatus. The present invention also results in a lower noise level on a memory card because simultaneous driver switching is minimized.

BRIEF DESCRIPTION OF THE DRAWING

FIG. 4 is a block diagram of the memory system of the present invention.

BEST MODE FOR CARRYING OUT THE INVENTION

Figure 1:
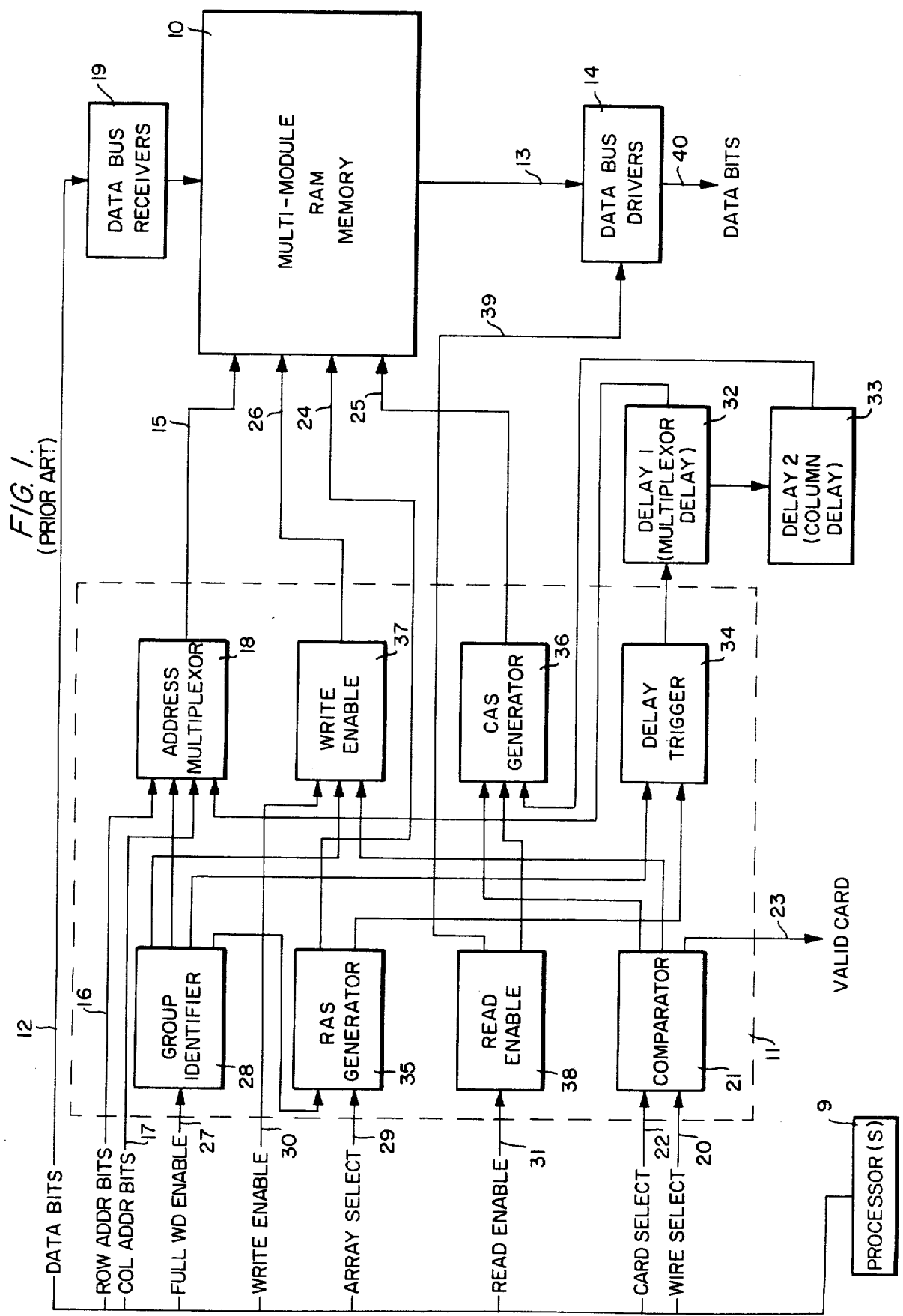
FIG. 1 is a block diagram of a previous memory system.

FIG. 1 illustrates an example of a memory system which includes a memory 10 and an access control circuit 11. Circuit 11 has sometimes been placed on a single integrated circuit. Memory 10 typically resides on one card. This card is comprised of several individual integrated circuit dynamic RAM modules. One or more processors 9 write data into memory 10 via input data bus 12 and read data out of memory 10 via output data bus 13. The data read out of memory 10 via output data bus 13 passes through a plurality of data bus drivers 14 (one driver is provided for each bit in an output data word) to ensure that that data is sufficiently powered to reach its destination. Data written into memory 10 passes through a plurality of data bus receivers 19 (one receiver is also typically provided for each bit in the input data word).

A processor which reads/writes data from/to memory 10 selects the location within memory 10 that the data is to be read from or written into via address bus 15. The processor generates row and column address bits and places them on row address bus 16 and column address bus 17, respectively. These row and column and address bits are routed to an address multiplexor 18. Multiplexor 18 switches the row address bits and then column address bits (or vice versa) onto address bus 15. This multiplexing of groups of address bits is necessary because the width of address bus 15 is such that only part of the complete address (e.g., half) can be routed to memory 10 at one time.

In addition to generating the address of a selected location for a particular memory operation, the processor must also generate several other signals. Because several cards like memory 10 may be typically combined to form a large memory (each card accommodating a plurality of RAM modules), it is necessary to supplement the basic row and column address bits (which serve to select a specific location within one or a group of RAM modules) with selection signals which route the row and column address bits to the appropriate RAM module(s). Wire card lines 20 are set up by board wiring to assign a unique address to each card which accommodates a memory 10. Comparator 21 compares the card select signal 22 generated by the processor with the unique address on wire card line 20. If these signals are the same the valid card signal 23 is activated and the designated card selected. The Row Address Strobe (RAS) 24, Column Address Strobe (CAS) 25 and Write Enable 26 signals (which are generated by RAS generator 35, CAS generator 36 and write enable 37, respectively) can only be gated to a selected RAM module(s) when the valid card signal 23 is activated.

Once one memory 10 card out of the plurality of cards within the large overall memory is selected, it is then necessary to further select one or a group of RAM modules to which the row and column address bits are gated. Full word Enable Lines 27 and Group Identifier 28 facilitate this module selection. Each RAM module or group of modules eligible for selection has a unique address which is provided to Group Identifier 28 by Full Word Enable lines 27. This selection of a single RAM module or group of modules coupled with the card selection function and the row and column address bits pinpoint the precise location within memory 10 where an operation is to be performed.

Figure 2:
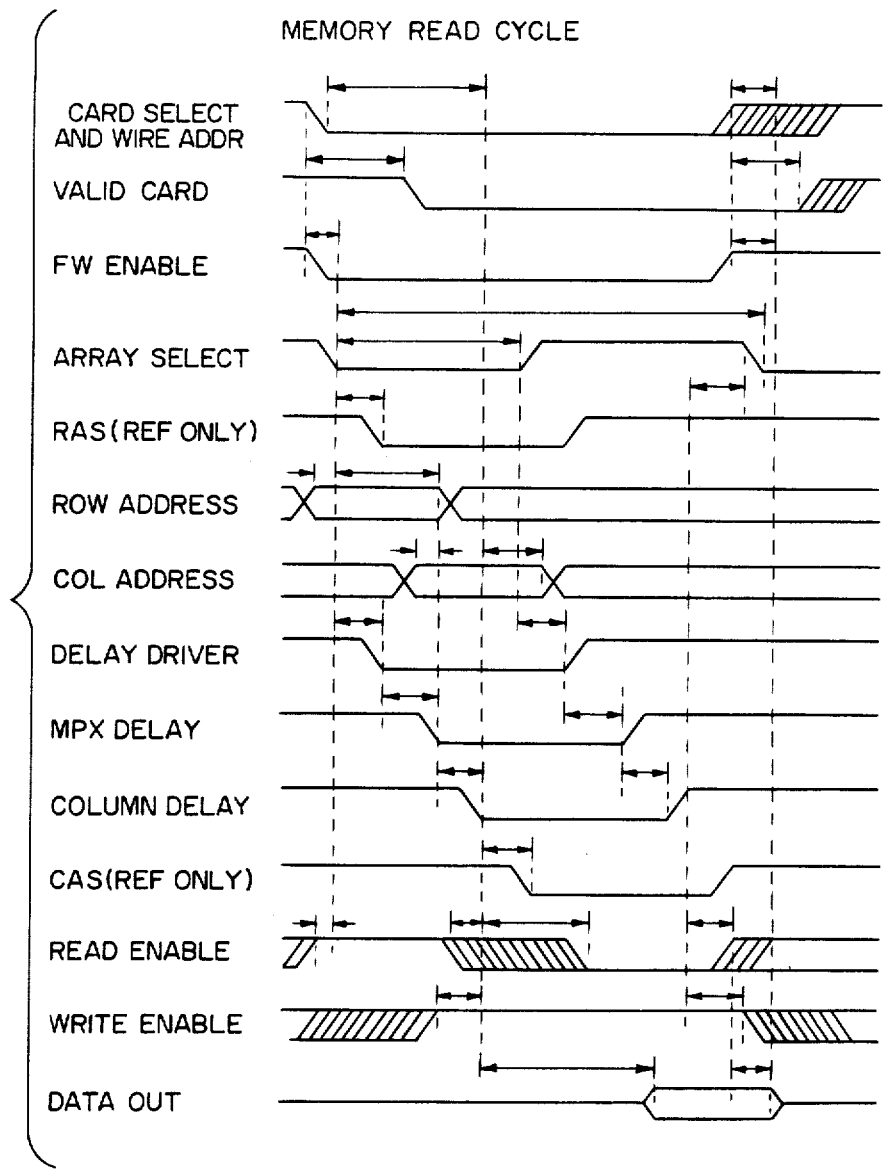
FIG. 2 is a timing diagram for a memory read cycle for the memory system of FIG. 1.

One of the operations which can be performed by the processor on memory 10 is to read out the data stored in the location selected by the process described above. FIG. 2 illustrates the timing relationships among the various signals involved in a memory read cycle.

Referring again to FIG. 1, a read operation is initiated by the Array Select line 29 going active while the Write Enable Line 30 is inactive. The row address and column address bits are used to address a word within a selected group of RAM modules. The RAS signal 24 and CAS signal 25 are gated by the Full Word Enable line 27 which selects a RAM module(s) within a card. The Read Enable line 31 is activated and Read Enable 38 generates a corresponding Read Enable Signal 39 to allow data to be placed on output data bus 40. CAS signal 25 is held active until Read Enable line 30 is deactivated.

Figure 3:
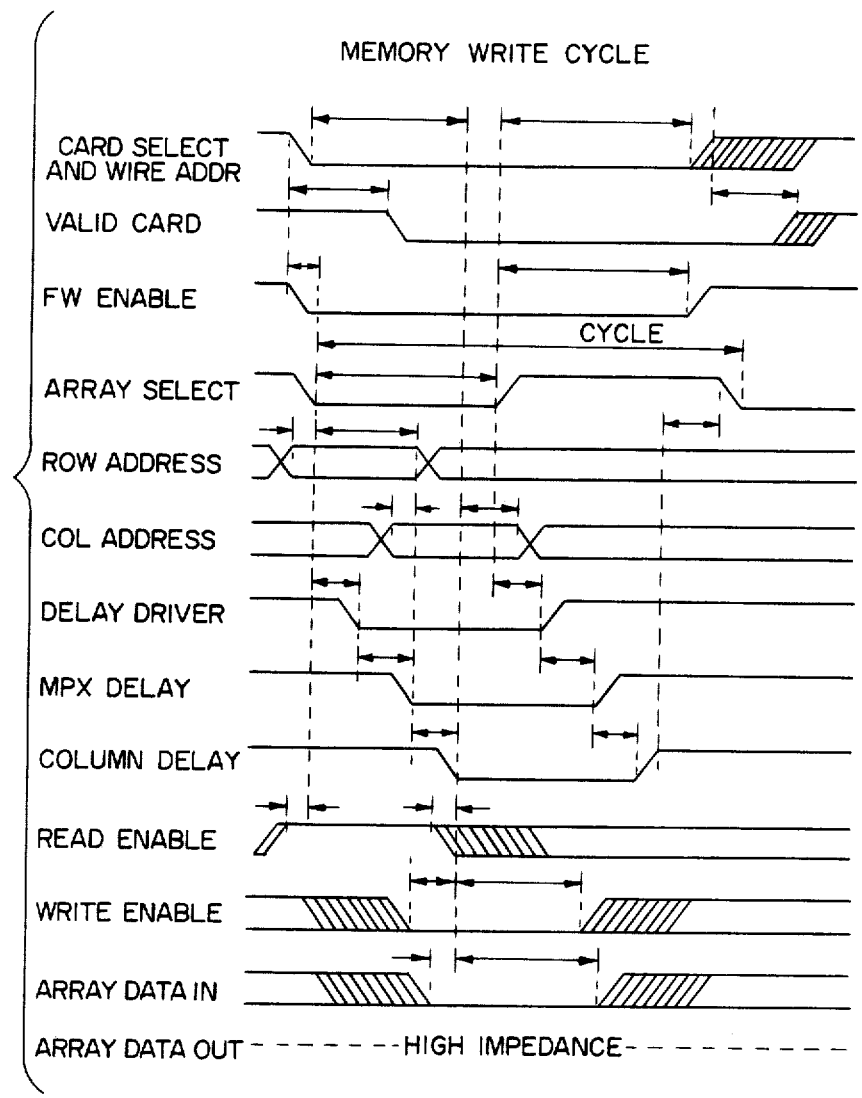
FIG. 3 is a timing diagram for a memory write cycle for the memory system of FIG. 1.

Another operation which can be performed on memory 10 is for the processor to write data into a selected location in memory. FIG. 3 illustrates the timing relationships among the various signals involved in a memory write cycle.

Referring again to FIG. 1, a write operation is initiated by Array Select line 29 going active while Write Enable line 30 is active. The data on input data bus 12 is written into the word addressed by the row and column address bits. The data must be valid on input data bus 12 before CAS signal 25 is activated.

The two delay lines 32 and 33 shown in FIG. 1 each provide a fixed delay to assist in properly controlling accesses to memory 10 via multiplexed address bus 13. Neither of these delay lines have been included in the single integrated circuit of circuit 11. Delay trigger 34 activates delay line 32 after the RAS bits have been generated. The fixed delay provided by delay line 32 represents the time allotted for the row address bits to be strobed into memory 10 by the RAS bits. The expiration of the first delay period in turn activates delay line 33. This second fixed delay period created by delay line 33 falls between the switching of address bus 15 from row address bits to column address bits and the generation of CAS bits 25. Delay line 33 serves to ensure that a sufficient amount of time elapses between these two events so that stable column address bits are accurately strobed into memory 10.

FIG. 4 functionally illustrates the circuit of the present invention. The use of dynamic delay 41 eliminates the delay trigger 34, delay line 32 and delay line 33 of the previous memory system illustrated in FIG. 1. This alone results in a less expensive and more reliable memory system. Moreover, the memory system of the present invention substantially decreases memory access time and thus improves overall system performance. In addition, the present invention incorporates dynamic delay 41 into circuit 42. Circuit 42 is manufactured such that it resides on a single integrated circuit. This eliminates tracking related problems such as differences in temperature induced timing delays, power supply variations or technology variations, between delay lines 32 and 33 (i.e., off-chip delay lines) used in previous systems (see FIG. 1) and the remainder of the access control circuit 11 (see FIG. 1).

The circuit of FIG. 4 results in substantially reduced memory access times by first activating dynamic delay 41 as soon as all RAS bits have been generated by RAS generator 35. Second, CAS bits are generated by CAS generator 45 as soon as address multiplexor 43 has switched the address bits on address bus 15 from row address bits to column address bits. No error-prone fixed delay is imposed. Instead the CAS bits are generated at the earliest possible moment. This eliminates the problems of overly long fixed delays which unnecessarily retard memory accesses and fixed delays which are too short which result in erroneous memory accesses.

Figure 5:
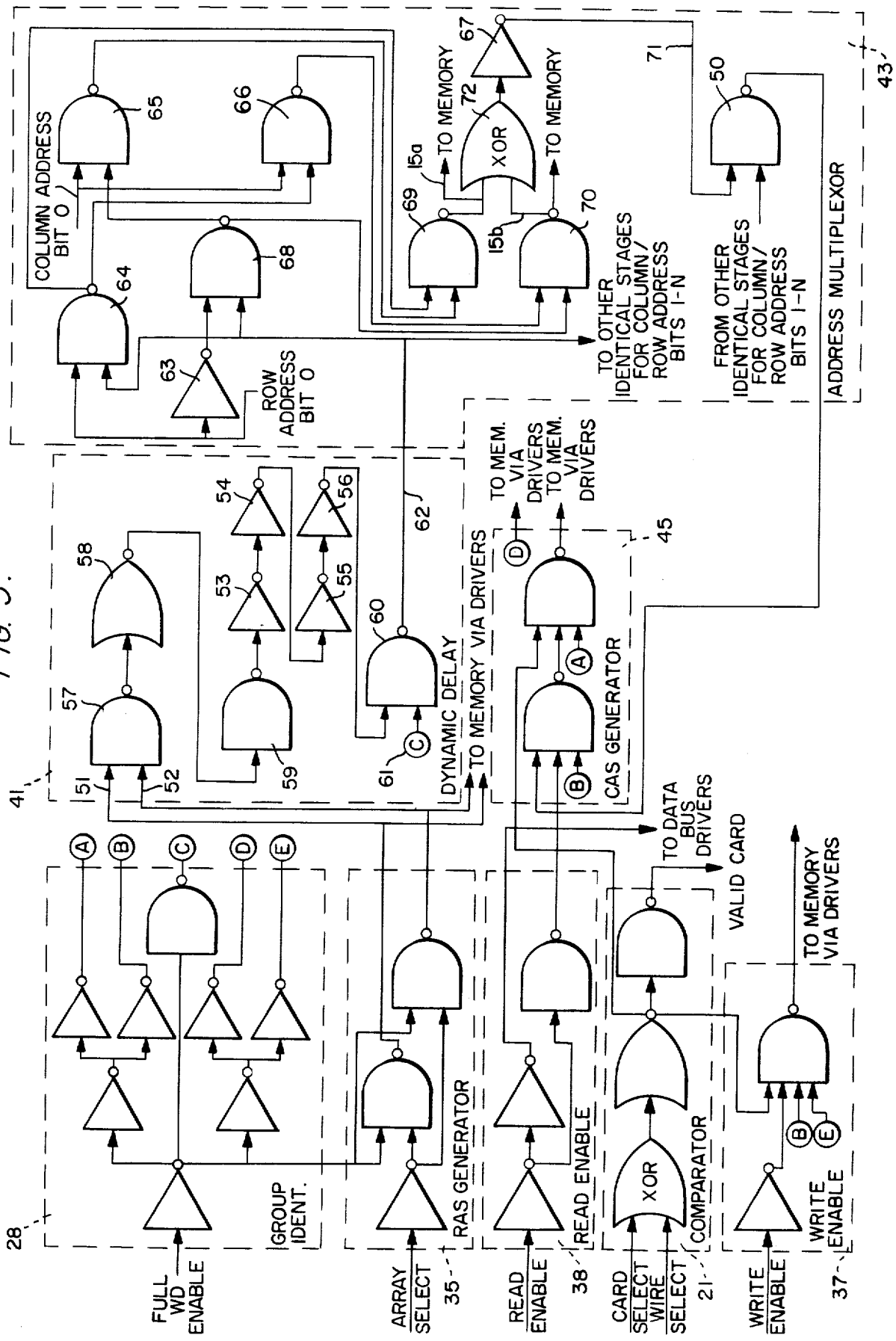
FIG. 5 is a detailed logic function diagram of the present invention.

FIG. 5 illustrates in detail one of many possible logical embodiments of circuit 42 of FIG. 4. Of particular interest is dynamic delay 41 and address multiplexor 43. As is readily apparent to one skilled in the art, the circuit shown in FIG. 5 employs negative active logic. Therefore, a line that is "enabled" or "active" is "low"

or a "logical 0". A line that is "disabled" or "inactive" is "high" or a "logical 1". Note that the address multiplexor shown in FIG. 5 depicts only the circuitry associated with a single row address bit and a single column address bit (i.e., bit 0). This circuitry (i.e., inverters/receivers 63 and 67 and gates 64, 65, 66, 68, 69, 72 and 70) is merely duplicated for each additional address bit 1-N. Line 62 is also routed to these duplicated address bit stages. Lines equivalent to line 71 are also routed to gate 50 from these duplicated address bit stages. It is also appropriate to clarify that, although clear to one with ordinary skill in the memory accessing art, that many of the lines depicted in FIG. 1, FIG. 4 and FIG. 5 in reality consist of more than a single line (e.g., input data bus 12 and address but 15 are multi-line/bit busses). These figures are intended only to illustrate the essential logical and functional relationships employed within the memory systems described. The actual number of lines/bits necessary for a particular application are, of course, application dependent and left to the designer.

Dynamic delay 41 is connected to multiplexor 43 via delay line 62. Multiplexor 43 comprises row selector logic 63, 64, and 68, column selector logic 65 and 66, memory output logic 69 and 70, and switch detect logic 72, 67, and 50.

At the start of a memory cycle, the RAS generator 35 is disabled (lines 51 and 52 are both high). After propagating through delay circuitry 41, line 62 is disabled (line 62 is high). Column selector logic is disabled (outputs of gates 65 and 66 are high regardless of what is on column address bit line). Row selector logic 64 and 68, in conjunction with memory output logic 69 and 70 send row address bits to memory via address line 15a, and the complement of the row address bits to address line 15b, waiting to be strobed by RAS generator 35 into memory. Address lines 15a and 15b make up address bus 15 as shown in FIG. 4. Since address lines 15a and 15b will always be complements of each other, the output of XOR gate 72 will always be high, and when the outputs of the XOR gates from the other identical stages also go high, gate 50 goes high. The output of gate 50 feeds back to disable the line going to the CAS generator 45 (enabled from the previous cycle). Thus, the switch detect logic of the multiplexor is able to determine conclusively and reliably that the multiplexor has switched from column address bits (left over from previous cycle) back to row address bits by directly analyzing the address bus. Switch detect logic then immediately disables the line going to the CAS generator.

RAS generator 35 is now enabled (lines 51 and 52 are low) and the row address bits are strobed into memory 10 while the RAS enable signal propagates through the dynamic delay circuit 41. Inverters 53, 54, 55, and 56 as well as gates 58 and 59 provide the delay time necessary for the row address bits to be properly strobed into memory 10. Gate 60 serves to prohibit dynamic delay 41 from activating address multiplexor 43 if a proper RAM module(s) is not selected by group identifier 28 via line 61. Thus, delay line 62 is enabled (line 62 is low) when the row address bits are completely strobed into memory. Row selector logic is now disabled (outputs of gates 64 and 68 are both high, regardless of what is on row address bit line). Column selector logic 65 and 66, in conjunction with memory output logic 69 and 70, send column address bits to memory via address lines 15a and 15b. Since both memory lines 15a and 15b always contain the same data, the output of XOR gate 72 will always be low, and when the outputs of the XOR gates from the other identical stages also go low, gate 50 goes low. The output of gate 50 feeds back to enable CAS generator 45. Thus, the switch detect logic of the multiplexor is able to determine conclusively and reliably that the multiplexor has switched from row address bits to column address bits by directly analyzing the address bus. Switch detect logic then immediately enables the CAS generator, without extra delay, to begin strobing the column address bits into memory.

RAS generator 35 is disabled (lines 51 and 52 are both high) and the column address bits are strobed into memory 10 while the RAS disable signal propagates through the dynamic delay circuit 41. Delay line 62 is now disabled, and multiplexor 43 switches from column addresses back to row addresses and disables the line going to CAS generator 45 in preparation for a new cycle, as described above.

The present invention also results in a lower noise level on a memory card because simultaneous driver switching is minimized. Half of the drivers (e.g., row) switch in one direction while the other half (e.g., column) switch in the opposite direction. This switching technique has the effect of cancelling noise. The noise reduction resulting from this cancellation effect not only provides the benefit of a lower noise level on the memory card but it also allows faster drivers to be used (i.e., the faster the drivers, the higher the noise). The ability to use faster drivers, of course, speeds up overall memory operations.

Figure 6:
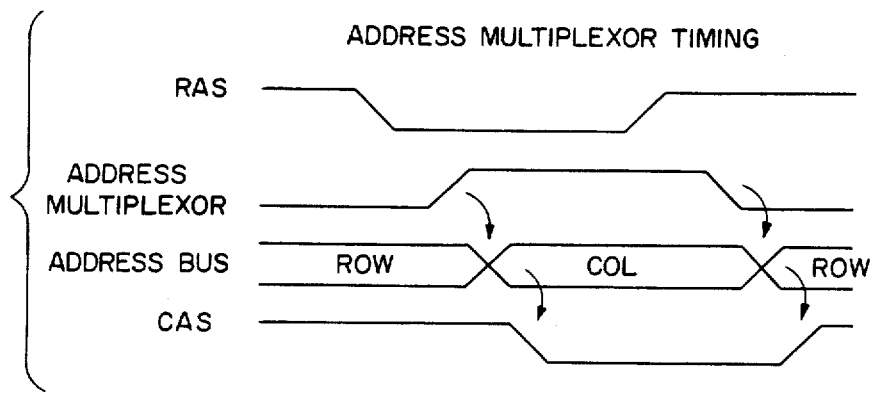
FIG. 6 is a diagram of the address multiplexor timing for the present invention.

FIG. 6 illustrates the timing sequence associated with the operation described above in conjunction with FIG. 5. Row address bits are initially present on the address bus. The RAS signal is then activated (i.e., transitions from a high logic level to a low logic level) to strobe these row address bits into the memory. After this occurs the address multiplexor is activated which results in the replacement of row address bits with column address bits on the address bus. This multiplexing operation is then immediately followed by the generation of the CAS signal which strobes the column address bits into the memory.

Whereas I have illustrated and described the preferred embodiments of my invention, it is understood that I do not limit myself to the precise constructions disclosed herein. I expressly reserve the right to all changes and modifications coming within the scope of the invention and defined in the appended claims.

I claim:
1. A method for efficiently accessing a selected location within a memory organized by rows and columns comprising the steps of:
  placing a plurality of row address bits on an address bus;
  generating a plurality of row address strobe bits for strobing said row address bits into said memory;
  activating a dynamic delay element and thereby initiating a delay period after all of said plurality of row address strobe bits have been generated;
  switching a multiplexing element from said row address bits to column address bits after said delay period has elapsed;
  placing a plurality of column address bits on said address bus after said delay period has elapsed;
  detecting that said multiplexing element has switched from said row address bits to said column address bits by analyzing said address bus; and generating a plurality of column address strobe bits for strobing said plurality of column address bits into said memory after said detection step detects that all of the address bits on said address bus have been switched from said plurality of row address bits to said plurality of column address bits.

2. A method for efficiently accessing a selected location within a memory comprising the steps of:
  placing a first group of address bits on an address bus;
  generating a first group of address strobe bits for strobing said first group of address bits into said memory;
  activating a delay element and thereby initiating a delay period after all of said first group of address strobe bits have been generated;
  switching a multiplexing element from said first group of address bits to a second group of address bits;
  placing a second group of address bits on said address bus after said delay period has elapsed;
  detecting that said multiplexing element has switched from said first group of address bits to said second group of address bits by analyzing said address bus; and
  generating a second group of address strobe bits for strobing said second group of address bits into said memory after said detection step detects that all of the address bits on said address bus have been switched from said first group of address bits to said second group of address bits.

3. A method for efficiently accessing a selected location within a memory organized by rows and columns comprising the steps of:
  placing a plurality of row address bits on an address bus;
  generating a plurality of row address strobe bits for strobing said plurality of row address bits into said memory;
  activating a dynamic delay element and thereby initiating a delay period immediately after all of said plurality of row address strobe bits have been generated;
  switching a multiplexing element from said row address bits to column address bits after said delay period has elapsed;
  placing a plurality of column address bits on said address bus after said delay period has elapsed;
  detecting that said multiplexing element has switched from said row address bits to said column address bits by analyzing said address bus; and
  generating a plurality of column address strobe bits for strobing said plurality of column address bits into said memory immediately after said detection step detects that all of the address bits on said address bus have been switched from said plurality of row address bits to said plurality of column address bits.

4. A method for efficiently accessing a selected location within a memory comprising the steps of:
  placing a first group of address bits on an address bus;
  generating a first group of address strobe bits for strobing said first group of address bits into said memory;
  activating a delay element and thereby initiating a delay period immediately after all of said first group of address strobe bits have been generated;
  switching a multiplexing element from said first group of address bits to a second group of address bits;
  placing a second group of address bits on said address bus after said delay period has elapsed;
  detecting that said multiplexing element has switched from said first group of address bits to said second group of address bits by analyzing said address bus; and
  generating a second group of address strobe bits for strobing said second group of address bits into said memory immediately after said detection step detects that all of the address bits on said address bus have been switched from said first group of address bits to said second group of address bits.

5. An apparatus for efficiently accessing a selected location within a memory organized by rows and columns including
  an address bus coupled to said memory for routing the address of said selected location to said memory;
  a first generating means coupled to said address bus for generating a plurality of row address bits;
  a second generating means coupled to said memory for generating a plurality of row address strobe bits which strobe said plurality of row address bits into said memory;
  a dynamic delay means coupled to said second generating means for providing a time delay, said delay means being activated by said second generating means after all said plurality of row address strobe bits have been generated;
  a third generating means coupled to said address bus for generating a plurality of column address bits;
  a multiplexor means coupled to said address bus, said first generating means, said third generating means and said delay means for alternatively switching said plurality of row address bits and said plurality of column address bits onto said address bus, said multiplexor means switching the bits on said address bus from said plurality of row address bits to said plurality of column address bits after said time delay has elapsed, said multiplexor means further including
    a logic means coupled to said address bus for detecting when said address bus has been completely switched from said plurality of row address bits to said plurality of column address bits by analyzing said address bus and
  a fourth generating means coupled to said multiplexor means and said memory for generating a plurality of column address strobe bits which strobe said plurality of column address bits into said memory, said fourth generating means generating said plurality of column address bits after said multiplexor means has switched the bits on said address bus from said plurality of row address bits to said plurality of column address bits.

6. An apparatus for efficiently accessing a selected location within a memory organized by rows and columns including
  an address bus coupled to said memory for routing the address of said selected location to said memory;
  a first generating means coupled to said address bus for generating a plurality of row address bits and a plurality of column address bits;

a second generating means coupled to said memory for generating a plurality of row address strobe bits which strobe said plurality of row address bits into said memory;

a delay means coupled to said second generating means for providing a time delay, said delay means being activated by said second generating means after all of said plurality of row address strobe bits have been generated;

a multiplexor means coupled to said address bus, said first generating means and said delay means for alternatively switching said plurality of row address bits and said plurality of column address bits onto said address bus, said multiplexor means switching the bits on said address bus from said plurality of row address bits to said plurality of column address bits after said time delay has elapsed, said multiplexor means further including a logic means coupled to said address bus for detecting when said address bus has been completely switched from said plurality of row address bit to said plurality of column address bits by analyzing said address bus; and a third generating means coupled to said multiplexor means and said memory for generating a plurality of column address strobe bits which strobe said plurality of column address bits into said memory, said third generating means generating said plurality of column address bits after said multiplexor means has switched the bits on said address bus from said plurality of row address bits to said plurality of column address bits.

7. An apparatus for efficiently accessing a selected location within a memory including:

an address bus coupled to said memory for routing the address of said selected location to said memory;

a first generating means coupled to said address bus for generating at least a first group of address bits and a second group of address bits;

a second generating means coupled to said memory for generating a first group of address strobe bits which strobe said first group of address bits into said memory;

a delay means coupled to said second generating means for providing a time delay, said delay means being activated by said second generating means after all said first group of address strobe bits have been generated;

a multiplexor means coupled to said address bus, said first generating means and said delay means for alternatively switching said first group of address bits and said second group of address bits onto said address bus, said multiplexor means switching the bits on said address bus from said first group of address bits to said second group of address bits after said time delay has elapsed, said multiplexor means further including a detection means coupled to said address bus for detecting when said address bus has been switched from said first group of address bits to said group of address bits by analyzing said address bus and a third generating means coupled to said multiplexor means and said memory for generating a second group of address strobe bits which strobe said second group of address bits into said memory, said third generating means generating said second group of address strobe bits after said multiplexor means has switched the bits on said address bus from said first group of address bits to said second group of address bits.

* * * * *